United States Patent
Joo et al.

(10) Patent No.: US 11,094,369 B1
(45) Date of Patent: Aug. 17, 2021

(54) SEMICONDUCTOR MEMORY DEVICE AND OPERATING METHOD THEREOF

(71) Applicant: SK hynix Inc., Gyeonggi-do (KR)

(72) Inventors: Nogeun Joo, Gyeonggi-do (KR);
Jungho Lim, Gyeonggi-do (KR);
Byeongchan Choi, Gyeonggi-do (KR);
Jeongtae Hwang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/928,192

(22) Filed: Jul. 14, 2020

(30) Foreign Application Priority Data

Feb. 14, 2020 (KR) .................... 10-2020-0018293

(51) Int. Cl.
*G11C 11/406* (2006.01)
*G11C 11/4091* (2006.01)
*G11C 11/408* (2006.01)
*G11C 7/10* (2006.01)

(52) U.S. Cl.
CPC .......... *G11C 11/4091* (2013.01); *G11C 7/106* (2013.01); *G11C 7/1087* (2013.01); *G11C 11/406* (2013.01); *G11C 11/4082* (2013.01); *G11C 11/4085* (2013.01); *G11C 11/40607* (2013.01); *G11C 11/40615* (2013.01); *G11C 11/40618* (2013.01)

(58) Field of Classification Search
CPC .......... G11C 11/4091; G11C 11/40615; G11C 11/4082; G11C 11/4085; G11C 11/406; G11C 11/40607; G11C 11/40618; G11C 7/106; G11C 7/1087

USPC ................. 365/189.05, 222, 230.06
See application file for complete search history.

(56) References Cited

U.S. PATENT DOCUMENTS

| | | | |
|---|---|---|---|
| 8,923,084 B1 * | 12/2014 | Song ................. | G11C 11/40611 365/222 |
| 9,396,786 B2 * | 7/2016 | Yoon ................. | G11C 11/40615 |
| 9,947,384 B1 * | 4/2018 | Ka ...................... | G11C 11/408 |
| 9,978,440 B2 * | 5/2018 | Cho .................... | G11C 11/408 |
| 10,249,359 B2 * | 4/2019 | Jung ................... | G11C 11/4085 |
| 10,388,363 B1 | 8/2019 | Ito | |
| 10,957,377 B2 * | 3/2021 | Noguchi ........... | G11C 11/40611 |

FOREIGN PATENT DOCUMENTS

KR    10-2018-0125657    11/2018

* cited by examiner

*Primary Examiner* — Son L Mai
(74) *Attorney, Agent, or Firm* — IP & T Group LLP

(57) ABSTRACT

A semiconductor memory device includes a cell array including a plurality of word lines; a plurality of address storing circuits, each of the plurality of address storing circuits suitable for storing a sampling address as a latch address, a valid bit indicating whether the latch address is valid, and a valid-lock bit indicating whether the latch address is accessed more than a certain number of times, each of the plurality of address storing circuits further suitable for outputting the latch address as a target address according to the valid bit and valid-lock bit; and a row control circuit suitable for refreshing one or more word lines based on the target address in response to a refresh command.

24 Claims, 18 Drawing Sheets

FIG. 11A

| 210_1 | B | 1 | 0 |
|---|---|---|---|
| 210_2 | C | 1 | 0 |
| 210_3 | D | 1 | 0 |
| 210_4 |   | 0 | 0 |
| 210_5 | E | 1 | 0 |

⇩ Input sampling address (A)

| 210_1 | B | 1 | 0 |
|---|---|---|---|
| 210_2 | C | 1 | 0 |
| 210_3 | D | 1 | 0 |
| 210_4 | A | 1 | 0 |
| 210_5 | E | 1 | 0 |

FIG. 11B

| 210_1 | B | 1 | 0 |
|---|---|---|---|
| 210_2 | C | 1 | 0 |
| 210_3 | D | 1 | 0 |
| 210_4 |   | 0 | 0 |
| 210_5 | E | 1 | 0 |

⇩ Input sampling address (C)

| 210_1 | B | 1 | 0 |
|---|---|---|---|
| 210_2 | C | 1 | 1 |
| 210_3 | D | 1 | 0 |
| 210_4 |   | 0 | 0 |
| 210_5 | E | 1 | 0 |

FIG. 11C

| 210_1 | B | 1 | 0 |
|---|---|---|---|
| 210_2 | C | 1 | 0 |
| 210_3 | D | 1 | 0 |
| 210_4 | A | 1 | 0 |
| 210_5 | E | 1 | 0 |

⇩ Input sampling address (F)

| 210_1 | B | 1 | 0 |
|---|---|---|---|
| 210_2 | C | 1 | 0 |
| 210_3 | D | 1 | 0 |
| 210_4 | A | 1 | 0 |
| 210_5 | E | 1 | 0 |

Discard sampling address (F)

FIG. 15

| | | | | | | | |
|---|---|---|---|---|---|---|---|
| 210_1 | B | 1 | 0 | B | 1 | 0 | 210_1 |
| 210_2 | C | 1 | 0 | C | 0 | 0 | 210_2 |
| 210_3 | D | 1 | 0 | D | 1 | 1 | 210_3 |
| 210_4 | | 0 | 0 | A | 1 | 0 | 210_4 |
| 210_5 | E | 1 | 0 | E | 1 | 1 | 210_5 |

⇩ Perform target refresh opration (C)

⇩ Perform sampling address storing opration

| | | | | | | | |
|---|---|---|---|---|---|---|---|
| 210_1 | B | 1 | 0 | B | 1 | 0 | 210_1 |
| 210_2 | C | 1 | 0 | C | 0 | 0 | 210_2 |
| 210_3 | D | 1 | 0 | D | 0 | 0 | 210_3 |
| 210_4 | A | 1 | 0 | A | 1 | 0 | 210_4 |
| 210_5 | E | 1 | 0 | E | 1 | 1 | 210_5 |

⇩ Perform target refresh opration (D)

⇩ Perform tracking opration

| | | | | | | | |
|---|---|---|---|---|---|---|---|
| 210_1 | B | 1 | 0 | B | 1 | 0 | 210_1 |
| 210_2 | C | 1 | 1 | C | 0 | 0 | 210_2 |
| 210_3 | D | 1 | 1 | D | 0 | 0 | 210_3 |
| 210_4 | A | 1 | 0 | A | 1 | 0 | 210_4 |
| 210_5 | E | 1 | 1 | E | 0 | 0 | 210_5 |

⇩ Perform target refresh opration (E)

SEMICONDUCTOR MEMORY DEVICE AND OPERATING METHOD THEREOF

CROSS-REFERENCE TO RELATED APPLICATIONS

The present application claims priority of Korean Patent Application No. 10-2020-0018293, filed on Feb. 14, 2020, which is incorporated herein by reference in its entirety.

BACKGROUND

1. Field

Various embodiments described herein relate to a semiconductor memory device and a method for operating a semiconductor memory device.

2. Description of the Related Art

Semiconductor memory devices include a plurality of memory cells. Each memory cell may include a transistor serving as a switch and a capacitor storing a charge (i.e., data). The data may have one of two logic levels, namely a high logic level (e.g., Logic 1) and a low logic level (Logic 0). The logic level of the data may depend on whether or not charge is stored in the capacitor, that is, whether the terminal voltage of the capacitor is high or low.

Since data are stored in the form of charges accumulated in the capacitor, theoretically storing data should not consume power. However, due to current leakage caused by a PN coupling of the transistor, an initial amount of charge stored in the capacitor of each memory cell may not be stably maintained. As a result, data stored in the memory cell may be lost. In an attempt to prevent losing data, data in the memory cell may be read before the data is lost and the capacitor may be recharged to ensure that a sufficient amount of charge is stored. This operation may be performed repeatedly at predetermined periods to retain accuracy of the data. (The process of recharging a memory cell may be referred to as a refresh operation, e.g., a 'normal refresh operation').

In addition to performing normal refresh operations, 'target refresh operations' may be performed on memory cells of word lines that are likely to lose data due to a row hammering phenomenon. Row hammering refers to a phenomenon in which data of memory cells coupled to a same word line, or word lines adjacent to a particular word line, are damaged or distorted due to a high activation frequency of that word line. In order to prevent row hammering, target refresh operations may be performed on a word line which is frequently activated (e.g., a predetermined number of times or more) or on adjacent word lines.

SUMMARY

Various embodiments are directed to a semiconductor memory device capable of performing a target refresh in accordance with operations that include tracking whether a latch address stored in an address storage circuit has been accessed more than a certain number of times and maintaining or discarding the latch address depending on the tracking result, and a method for operating the semiconductor memory device.

In accordance with an embodiment, a semiconductor memory device includes: a cell array including a plurality of word lines; a plurality of address storing circuits, each of the plurality of address storing circuits suitable for storing a sampling address as a latch address, a valid bit indicating whether the latch address is valid, and a valid-lock bit indicating whether the latch address is accessed more than a certain number of times, each of the plurality of address storing circuits further suitable for outputting the latch address as a target address according to the valid bit and valid-lock bit; and a row control circuit suitable for refreshing one or more word lines based on the target address in response to a refresh command.

In accordance with an embodiment, a semiconductor memory device includes: a random sampling circuit suitable for sampling active addresses input with an active command at random points and to output sampling addresses; a plurality of address storing circuits, each of the plurality of address storing circuits suitable for storing respective ones of the sampling addresses as latch addresses; and a row control circuit suitable for refreshing one or more word lines corresponding to a target address in response to a refresh command, wherein each of the address storing circuits includes: a latch circuit suitable for storing a corresponding one of the latch addresses, a valid bit, and a valid-lock bit; a tracking circuit suitable for activating a first setting signal or a first eviction signal according to a comparison result of the latch address and the active address during an evaluation period when the valid bit is set; a latch control circuit suitable for setting the valid-lock bit when the latch address is identical to the sampling address and the valid bit is set or when the first setting signal is activated and for releasing the valid bit and the valid-lock when the first eviction signal is activated; and an output control circuit suitable for outputting the latch address as the target address when the valid-lock bit is set and when the refresh command is activated.

In accordance with an embodiment, a method for operating a semiconductor memory device including a plurality of latch circuits, each of the plurality of latch circuits storing a latch address, a valid bit and a valid-lock bit, the method includes: setting the valid bit of one of the latch circuits after storing a sampling address as the latch address into the one of the latch circuits; setting the valid-lock bit of the one of the latch circuits when the sampling address identical to the latch address of the one of the latch circuits is input at least once; and outputting, from the one of the latch circuits, the latch address as a target address according to the valid bit and valid-lock bit and refreshing one or more word lines based on the target address in response to a refresh command.

In accordance with an embodiment, a semiconductor memory device includes: an input to receive a first address; and at least one processor suitable for generating a target address for a target refresh operation based on the first address, the at least one processor suitable for: receiving a second address, comparing the second address to the first address stored in a storage area, when the second address equals the first address, controlling output of the first address as the target address; and sending the target address to a controller to perform the target refresh operation based on the target address, wherein the first address and the second address are randomly sampled from an active address circuit.

These and other features and advantages of the embodiments disclosed herein will be better understood by those with ordinary skill in the field relating to the following detailed description in conjunction with the accompanying drawings.

BRIEF DESCRIPTION OF THE DRAWINGS

FIGS. 11A to 11C are diagrams for describing embodiments of operations described relative to FIG. 10.

FIG. 15 is a diagram for describing a state of a latch circuit in accordance with an embodiment.

DETAILED DESCRIPTION

Figure 1:
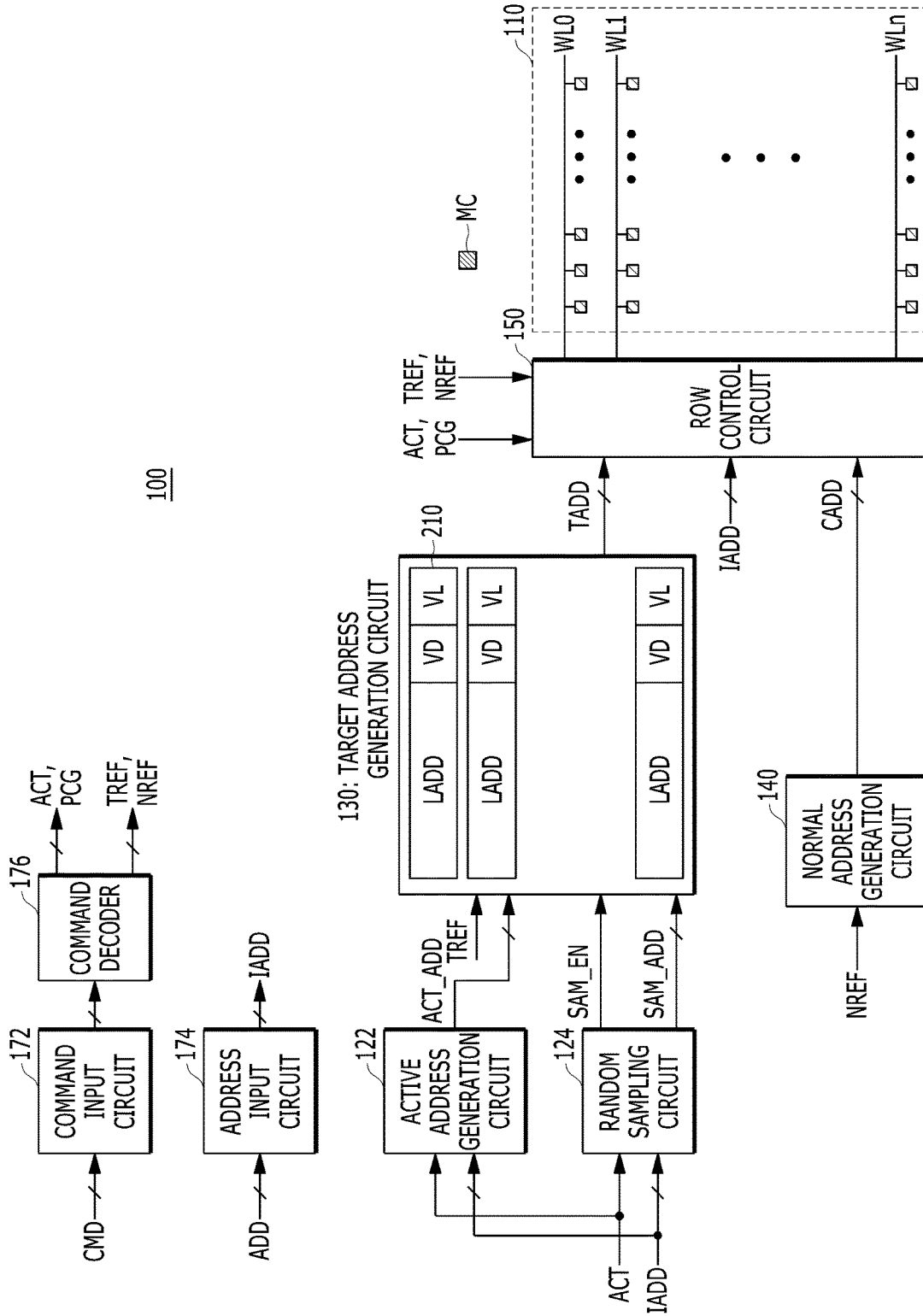
FIG. 1 is a block diagram illustrating a semiconductor memory device in accordance with an embodiment.

Various embodiments will be described below in more detail with reference to the accompanying drawings. The subject matter described, however, be embodied in different forms and should not be construed as limited to the embodiments set forth herein. Rather, these embodiments are provided so that this disclosure will be thorough and complete, and will fully convey the scope of the described subject matter to those skilled in the art. Throughout the disclosure, like reference numerals refer to like parts throughout the various figures and embodiments.

It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the described subject matter.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

As used herein, singular forms may include the plural forms as well and vice versa, unless the context clearly indicates otherwise. The articles 'a' and 'an' as used in this application and the appended claims should be construed to mean 'one or more' unless specified otherwise or clear from context to be directed to a singular form.

In one or more embodiments, an operation to sequentially refresh a plurality of word lines of a memory device may be defined as a normal refresh operation, and an operation to refresh one or more word lines adjacent to a word line with relatively high activation frequency (hereinafter referred to as a "high active word line") may be defined as a target refresh operation.

FIG. 1 is a block diagram illustrating a semiconductor memory device 100 in accordance with an embodiment. Referring to FIG. 1, the semiconductor memory device 100 may include a cell array 110, an active address generation circuit 122, a random sampling circuit 124, a target address generation circuit 130, a normal address generation circuit 140, a row control circuit 150, a command input circuit 172, an address input circuit 174, and a command decoder 176.

The cell array 110 may include a plurality of word lines WL0 to WLn, each coupled to one or more memory cells MC. The cell array 110 may also include a plurality of bit lines, each coupled to one or more of the memory cells MC.

The command input circuit 172 may receive a command CMD, and the address input circuit 174 may receive an address ADD. The address input circuit 174 may receive the address ADD and output an internal input address IADD. Each of the command CMD and the address ADD may include a multi-bit signal. The command decoder 176 may decode the command CMD input through the command input circuit 172 and may generate an active command ACT, a precharge command PCG, a normal refresh command NREF, and a target refresh command TREF. The command decoder 176 may generate a read command and a write command, as well as other commands, by decoding received commands CMD.

The active address generation circuit 122 may store the input address IADD, input together with the active command ACT, in order to output an active address ACT_ADD.

The random sampling circuit 124 may store the input address IADD corresponding to the active command ACT, for example, at a random point. At a random point, the random sampling circuit 124 may activate a sampling enable signal SAM_EN and sample the active address ACT_ADD to output a sampling address SAM_ADD according to the sampling enable signal SAM_EN. For example, the random sampling circuit 124 may generate the sampling address SAM_ADD by sampling the input address IADD, input together with the active command ACT, at the random point. While various embodiments performing random sampling, active address ACT_ADD may be sampled at other times in additional embodiments. For example, the active address ACT_ADD may be sampled at one or more set time points and/or when a set condition occurs during operation.

For reference, the input address IADD may indicate a word line to be activated (hereinafter, an "active word line") in response to the corresponding active command ACT. If an address of an active word line is stored at a random point, a target refresh operation may be performed on the active word line corresponding to the stored address and/or one or more word lines adjacent to the active word line. Thus, in at least one embodiment, it may not be necessary to count the number of all activated word lines in order to perform a target refresh operation. Implementing this approach, which does not use (e.g., omits) counters to count the number of all activated word lines, allows the size of the memory device to be substantially reduced or minimized. At the same time, this approach prevents word line disturbance that may otherwise occur, with at least a certain probability, due to the row hammering phenomenon. While embodiments have been discussed which perform sampling at one or more random points has been discussed, sampling may be performed at one or more set points and/or with a set frequency in other embodiments.

In one embodiment, the target address generation circuit 130 may store the sampling address SAM_ADD as a latch address LADD, according to the sampling enable signal SAM_EN. The target address generation circuit 130 may include a plurality of address storing circuits 210, each for storing a corresponding one of the latch addresses LADD. In one embodiment, each address storing circuit 210 may store a latch address LADD, a valid bit VD, and a valid-lock bit VL. The valid bit VD may indicate whether a corresponding latch address LADD is valid or not. The valid-lock bit VL may indicate whether the corresponding latch address LADD has been accessed more than a certain number of times.

One or more of the address storing circuits 210 may output their latch addresses LADD as target addresses TADD based on corresponding valid bits VD and valid-lock bits VL. For example, the target address generation circuit 130 may sequentially output a latch address LADD stored in respective address storing circuit 210, as target address TADD, according to the valid bits VD and the valid-lock bit VLs stored in a respective one of the address storing circuits 210.

In one embodiment, each target address TADD may indicate the address of a word line to be activated and refreshed during a target refresh operation. The target address TADD may indicate, for example, an address of a high active word line. In one embodiment, during the target refresh operation, one or more word lines adjacent to the high active word line may be refreshed. Hereinafter, a description will be provided of when the valid bit VD or valid-lock bit VL is set to a high bit and the valid bit VD or valid-lock bit VL is released to a low bit.

When a sampling address SAM_ADD is received, the target address generation circuit 130 may store the sampling address SAM_ADD as a latch address LADD in an address storing circuit 210 in which the valid bit VD is released and then set the valid bit VD of this address storing circuit after the latch address LADD has been stored. If there is no address storing circuit having a released valid bit VD, the target address generation circuit 130 may, for example, discard the sampling address SAM_ADD.

Each of the address storing circuits 210 may set its valid-lock bit VL when the sampling address SAM_ADD identical to the latch address LADD is input at least once. In one embodiment, each of the address storing circuits 210 may set its valid-lock bit VL when the active address ACT_ADD identical to the latch address LADD is input more than a first preset number of times, for example, during an evaluation period (tEV) in which the target refresh command TREF is activated a certain number of times.

Each of the address storing circuits 210 may release its valid bit VD and its valid-lock bit VL when the active address ACT_ADD identical to the latch address LADD is input less than a second preset number of times, during the evaluation period (tEV). The second preset number may be different from (e.g., less than) the first preset number. For example, each of the address storing circuits 210 may set its valid-lock bit VL when the active address ACT_ADD identical to the latch address LADD is input 5 times during the evaluation period (tEV) in which the target refresh command TREF is activated "x" times. For example, each of the address storing circuits 210 may release its valid bit VD and its valid-lock bit VL when the active address ACT_ADD identical to the latch address LADD is not input during the evaluation period (tEV) in which the target refresh command TREF is activated "x" times.

In one embodiment, the first preset number of times may correspond to a first threshold value TH1T and the second preset number of times may correspond to a second threshold value TH2. Each of the address storing circuits 210 may release its valid bit VD and its valid-lock bit VL after the latch address LADD is output as the target address TADD according to the target refresh command TREF.

The normal address generation circuit 140 may generate a counting address CADD having a value that changes based on refreshing of any of the word lines WL0 to WLn. For example, the normal address generation circuit 140 may increase a value of the counting address CADD whenever the normal refresh command NREF is activated. The counting address CADD may indicate an address of a word line to be activated and refreshed during a normal refresh operation. The normal address generation circuit 140 may change the value of the counting address CADD such that a (K+1)th word line WLK+1 is selected when a K-th word line WLK was previously selected.

The row control circuit 150 may activate a word line corresponding to the input address IADD in response to activation of the active command ACT, and may precharge the activated word line in response to the precharge command PCG. The row control circuit 150 may activate and refresh a word line corresponding to the counting address CADD in response to the normal refresh command NREF, and may activate and refresh a word line corresponding to the target address TADD in response to the target refresh command TREF.

The row control circuit 150 may refresh one or more adjacent word lines corresponding to addresses calculated, for example, by adding or subtracting 1 from the target address TADD. Although FIG. 1 shows that the target address generation circuit 130 outputs the latch address LADD as target address TADD, variations are possible. In an embodiment, the target address generation circuit 130 may provide the target address TADD to the row control circuit 150 by adding or subtracting 1 from the latch address LADD.

As described above, in accordance with an embodiment, the semiconductor memory device 100 may sequentially perform a normal refresh on the word lines WL0 to WLn in response to the normal refresh command NREF, which may be input periodically, and perform a target refresh on a word line in response to the target refresh command TREF. At this time, the memory device 100 may store the received random sampling address SAM_ADD as a latch address LADD and may use the stored latch address LADD to perform the target refresh operation, thereby reducing the possibility of the word line disturbance and reducing or minimizing the size of the memory device 100. For example, the memory devices 100 may manage the value-lock bit VL by tracking whether the stored latch address LADD has been accessed more than a certain number of times according to the active address ACT_ADD and the sampling address SAM_ADD. Thus, it is possible to improve the efficiency of the target refresh operation by filtering latch addresses LADD which are unlikely to cause the row hammering phenomenon.

Figure 2:
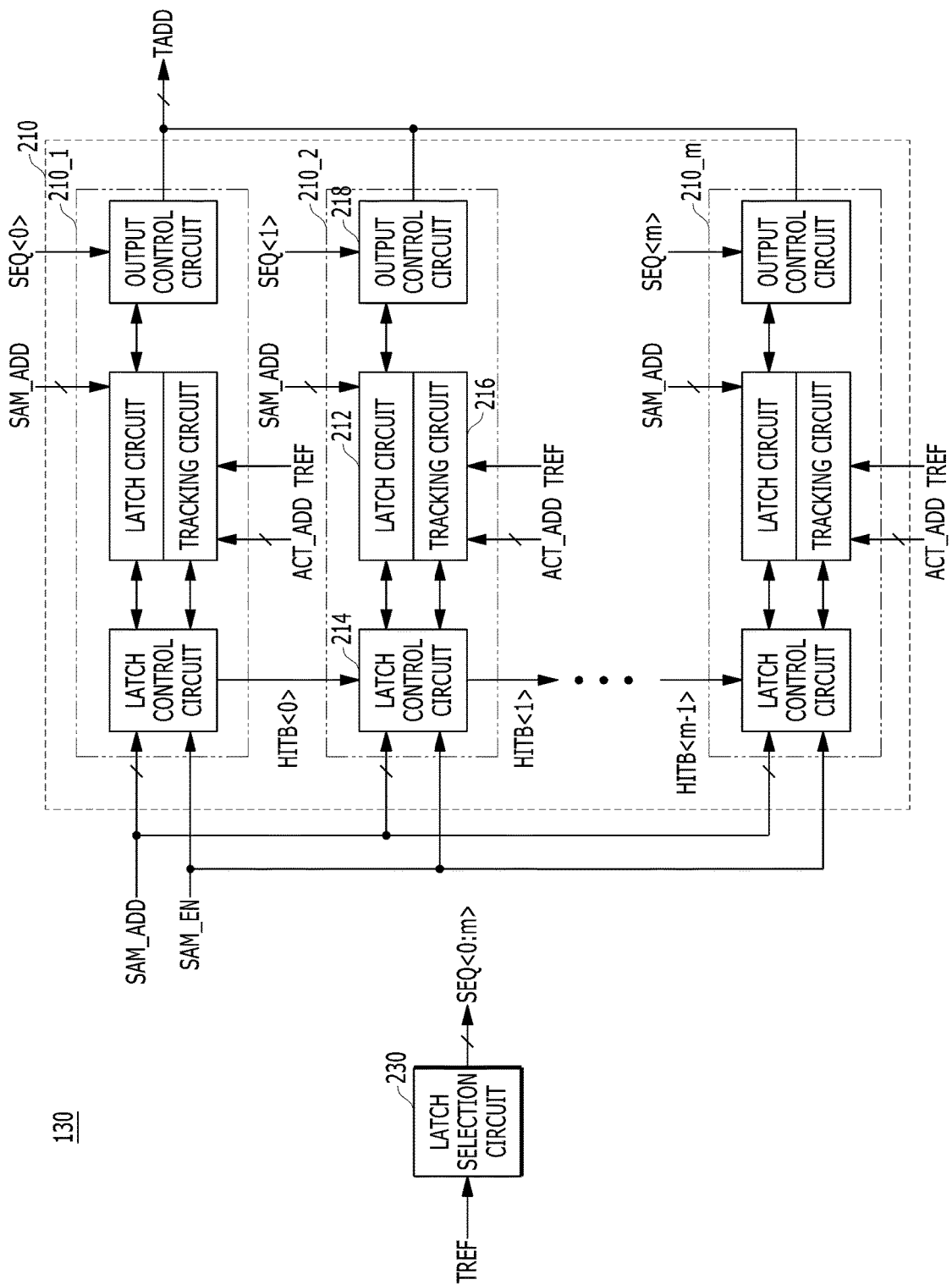
FIG. 2 is a detailed block diagram illustrating an embodiment of a target address generation circuit of FIG. 1.
Figure 3:
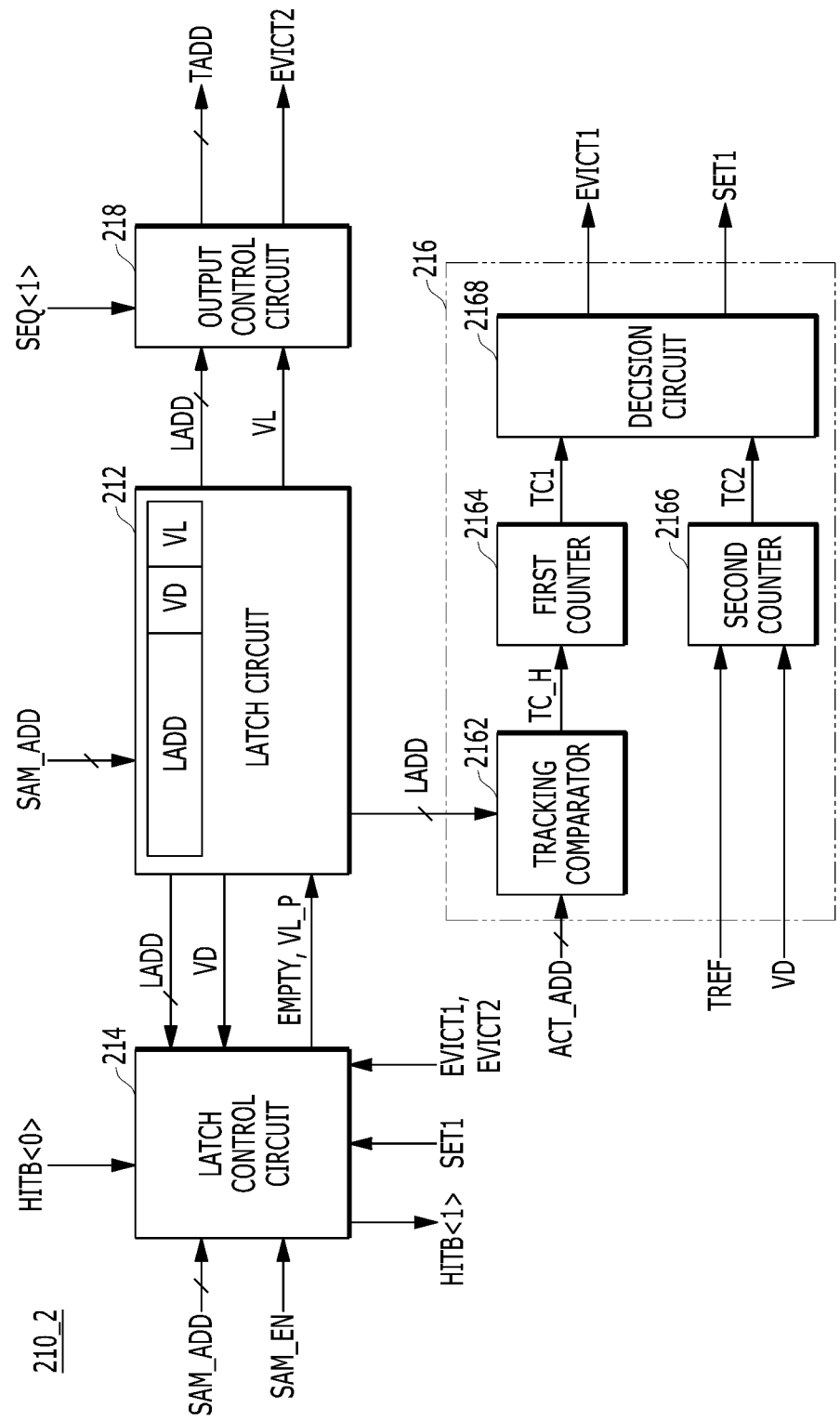
FIG. 3 is a detailed block diagram illustrating an embodiment of an address storing circuit of FIG. 2.

FIG. 2 is a detailed block diagram illustrating an embodiment of the target address generation circuit 130 of FIG. 1. FIG. 3 is a detailed block diagram illustrating an embodiment of a second address storing circuit 210_2 of FIG. 2.

Referring to FIG. 2, the target address generation circuit 130 may include the address storing circuits 210 and a latch selection circuit 230. The address storing circuits 210 may include first to m-th address storing circuits 210_1 to 210_m.

The latch selection circuit 230 may sequentially activate each bit of the latch selection signal SEQ<0:m> when the target refresh command TREF is activated. For example, the latch selection circuit 230 may activate a first bit SEQ<0> of the latch selection signal SEQ<0:m> when the target refresh command TREF is activated once. The latch selection circuit 230 may activate a second bit SEQ<1> of the latch selection signal SEQ<0:m> when the target refresh command TREF is activated twice. In this way, latch selection circuit 230 may activate an (m+1)-th bit SEQ<m> of the latch selection signal SEQ<0:m> when the target refresh command TREF is activated (m+1) times. When all bits of the latch selection signal SEQ<0:m> become a high bit, the latch selection circuit 230 may reset the latch selection signal SEQ<0:m> to have all row bits.

Each of the first to m-th address storing circuits 210_1 to 210_m may include a latch circuit 212, a latch control circuit 214, a tracking circuit 216, and an output control circuit 218. Since the first to m-th address storing circuits 210_1 to 210_m include substantially the same configuration, the second address storing circuit 210_2 will be explained as an example.

Referring to FIG. 3, the latch circuit 212 may store the latch address LADD, the valid bit VD, and the valid-lock bit VL. The valid bit VD may store information indicating whether the latch address LADD is valid or not. The valid-lock bit VL may store tracking information indicating whether the latch address LADD has been accessed more than a certain number of times, by tracking the latch address LADD according to the active address ACT_ADD and the sampling address SAM_ADD.

The tracking circuit 216 may compare the active address ACT_ADD with the latch address LADD during the evaluation period (tEV) when the valid bit VD is set. According to a comparison result, the tracking circuit 216 may increase a first counting value TC1. The tracking circuit 216 may activate a first setting signal SET1 when the first counting value TC1 is greater than or equal to the first threshold value TH1 during the evaluation period (tEV). The tracking circuit 216 may activate a first eviction signal EVICT1 when the first counting value TC1 is less than the second threshold value TH2 during the evaluation period (tEV). The first threshold value TH1 may be different from (e.g., greater than) the second threshold value TH2.

In one embodiment, the tracking circuit 216 may include a tracking comparator 2162, a first counter 2164, a second counter 2166, and a decision circuit 2168. The tracking comparator 2162 may compare the active address ACT_ADD with the latch address LADD and output a count hit signal TC_H when the active address ACT_ADD is identical to the latch address LADD.

The first counter 2164 may increase the first counting value TC1 according to the count hit signal TC_H.

The second counter 2166 may be activated according to the valid bit VD and may increase a second counting value TC2 when the target refresh command TREF is activated. At this time, according to the second counting value TC2, the evaluation period (tEV) may be defined. For example, assuming that the second counter 2166 is reset when the second counting value TC2 becomes "x", one evaluation period (tEV) may be defined as a section that the target refresh command TREF is input from one time to x-times, and a next evaluation period (tEV) may be defined as a section that the target refresh command TREF is input from (x+1) time to 2x-times.

The decision circuit 2168 may generate the first setting signal SET1 and the first eviction signal EVICT1 according to the first counting value TC1 and the second counting value TC2. The decision circuit 2168 may generate the first setting signal SET1 and the first eviction signal EVICT1 based on the first counting value TC1 until the second counting value TC2 reaches a set number of times. The decision circuit 2168 may activate the first setting signal SET1 when the first counting value TC1 is greater than or equal to the first threshold value TH1 during the evaluation period (tEV), e.g., until the second counting value TC2 reaches a set number of times.

The decision circuit 2168 may activate the first eviction signal EVICT1 when the first counting value TC1 is less than the second threshold value TH2 at an end of the evaluation period (tEV). In one embodiment, the first threshold value TH1 may be set to a maximum value of the first counter 2164 and the second threshold value TH2 may be set to 1. For example, the decision circuit 2168 may activate the first setting signal SET1 when the first counting value TC1 reaches the maximum value of the first counter 2164 before the evaluation period (tEV) is completed. The decision circuit 2168 may activate the first eviction signal EVICT1 when the first counting value TC1 is 0 at the end of the evaluation period (tEV). The decision circuit 2168 may reset the first counting value TC1 of the first counter 2164 and the second counting value TC2 of the second counter 2166, at the end of the evaluation period (tEV) when the second counting value TC2 reaches a set number of times.

The latch control circuit 214 may be activated according to the sampling enable signal SAM_EN and a no-hit signal HITB<0>, which is transferred from a latch control circuit (e.g., of the first address storing circuit 210_1) at a previous stage. When the valid bit VD is released, the latch control circuit 214 may control the latch circuit 212 to set the valid bit VD after storing the sampling address SAM_ADD. When the valid bit VD is set, the latch control circuit 214 may compare the sampling address SAM_ADD with the latch address LADD and control the latch circuit 212 to set the valid-lock bit VL when there is a match.

Further, the latch control circuit 214 may control the latch circuit 212 to set the valid-lock bit VL according to the first setting signal SET1. The latch control circuit 214 may control the latch circuit 212 to release the valid bit VD and the valid-lock bit VL according to the first eviction signal EVICT1 or a second eviction signal EVICT2. The latch control circuit 214 may provide a first control signal EMPTY and a second control signal VL_P to the latch circuit 212. The latch circuit 212 may store the latch address LADD according to the first control signal EMPTY and set the valid bit VD after storing the latch address LADD. The latch circuit 212 may set the valid-lock bit VL according to the second control signal VL_P.

The latch control circuit 214 may provide a no-hit signal HITB<1> to a latch control circuit (of the third address storing circuit 210_3) at a next stage, when the comparison result of the sampling address SAM_ADD and the latch address LADD indicates there is not a match, in a state that the valid bit VD is set. The latch control circuit 214 may not output the no-hit signal HITB<1> when the valid bit VD is released or the comparison result indicates that there is a match.

The output control circuit 218 may output the latch address LADD as the target address TADD according to the valid-lock bit VL, when the second bit SEQ<1> of the latch selection signal SEQ<0:m> is activated. When the valid-lock bit VL is set, the output control circuit 218 may output the latch address LADD as the target address TADD. When the valid-lock bit VL is released, the output control circuit 218 may block the latch address LADD from being output as the target address TADD, even when the valid bit VD is set. Depending on the embodiment, the output control circuit 218 may output the latch address LADD as the target address TADD when the valid bit VD is set. The output control circuit 218 may activate the second eviction signal EVICT2 after outputting the latch address LADD as the target address TADD.

Figure 4:
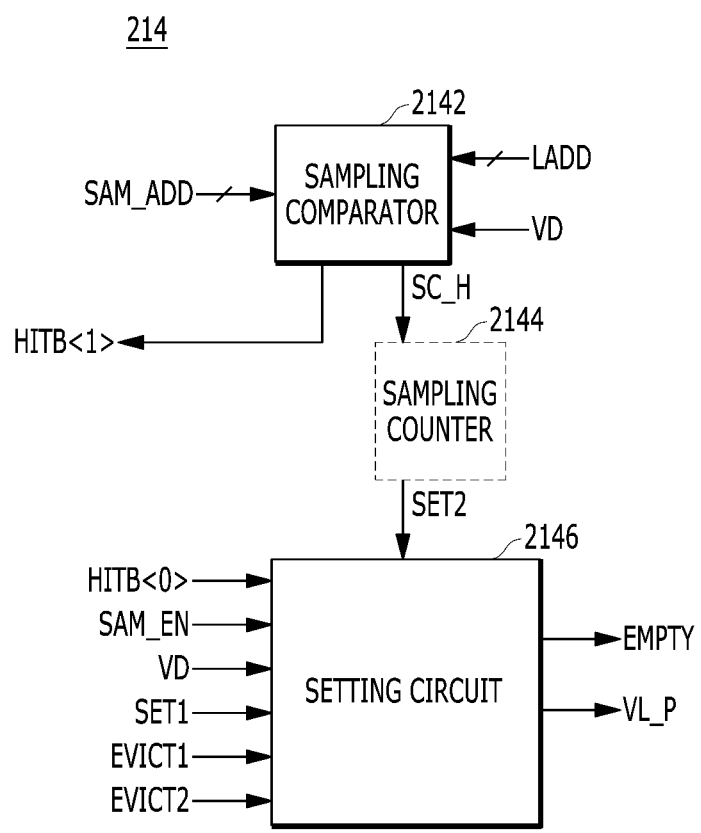
FIG. 4 is a detailed block diagram illustrating an embodiment of a latch control circuit of FIG. 3.

FIG. 4 is a detailed block diagram illustrating an embodiment of the latch control circuit 214 of FIG. 3. Referring to FIG. 4, the latch control circuit 214 may include a sampling comparator 2142, a sampling counter 2144, and a setting circuit 2146.

The sampling comparator 2142 may compare the sampling address SAM_ADD with the latch address LADD and output a sampling hit signal SC_H according to valid bit VD. The sampling comparator 2142 may be activated when the valid bit VD is set and may generate the sampling hit signal SC_H when the comparison result indicates a match. That is, the sampling comparator 2142 may activate according to the valid bit VD, and may output the sampling hit signal SC_H when the latch address LADD is identical to the sampling address SAM_ADD. The sampling comparator 2142 may output the no-hit signal HITB<1> when the comparison result does not match in a state that the valid bit VD is set. That is, the sampling comparator 2142 may output the no-hit signal HITB<1> when the latch address LADD is not identical to the sampling address SAM_ADD. The sampling comparator 2142 may provide the no-hit signal HITB<1> to the next latch control circuit (of the third address storing circuit 210_3).

The sampling counter 2144 may increase a sampling counting value according to the sampling hit signal SC_H and may activate a second setting signal SET2 when the sampling counting value reaches a target value. In one embodiment, the sampling counter 2144 may be omitted. For example, the latch control circuit 214 may control the latch circuit 212 to set the valid-lock bit VL when the sampling address SAM_ADD matches the latch address LADD at least once. In that case, the sampling counter 2144 may be omitted and the sampling hit signal SC_H may be used as the second setting signal SET2. Hereinafter, a case where the second setting signal SET2 is activated when the sampling counting value is greater than or equal to 1 will be explained.

The setting circuit 2146 may generate the first control signal EMPTY for setting or releasing the valid bit VD according to the sampling enable signal SAM_EN, the no-hit signal HITB<0> transferred from the previous latch control circuit, the first eviction signal EVICT1, and the second eviction signal EVICT2. The first control signal EMPTY may have a phase opposite to that of the valid bit VD. For example, when the first control signal EMPTY is activated to a logic high level, the valid bit VD is released to a low bit, or the first control signal EMPTY is activated to a logic low level, the valid bit VD is set to a high bit. When the sampling enable signal SAM_EN and the no-hit signal HITB<0> are activated in a state that the valid bit VD is released, the setting circuit 2146 may generate the first control signal EMPTY to store the sampling address SAM_ADD into the latch circuit 212 and to set the valid bit VD. The setting circuit 2146 may generate the first control signal EMPTY according to the first eviction signal EVICT1 and the second eviction signal EVICT2, to release the valid bit VD.

Further, the setting circuit 2146 may generate the second control signal VL_P for setting/releasing the valid-lock bit VL according to the first setting signal SET1, the second setting signal SET2, the first eviction signal EVICT1, and the second eviction signal EVICT2. For example, the setting circuit 2146 may generate the second control signal VL_P to set the valid-lock bit VL according to the first setting signal SET1 or the second setting signal SET2 and to release the valid-lock bit VL according to the first eviction signal EVICT1 or second eviction signal EVICT2.

Figure 5:
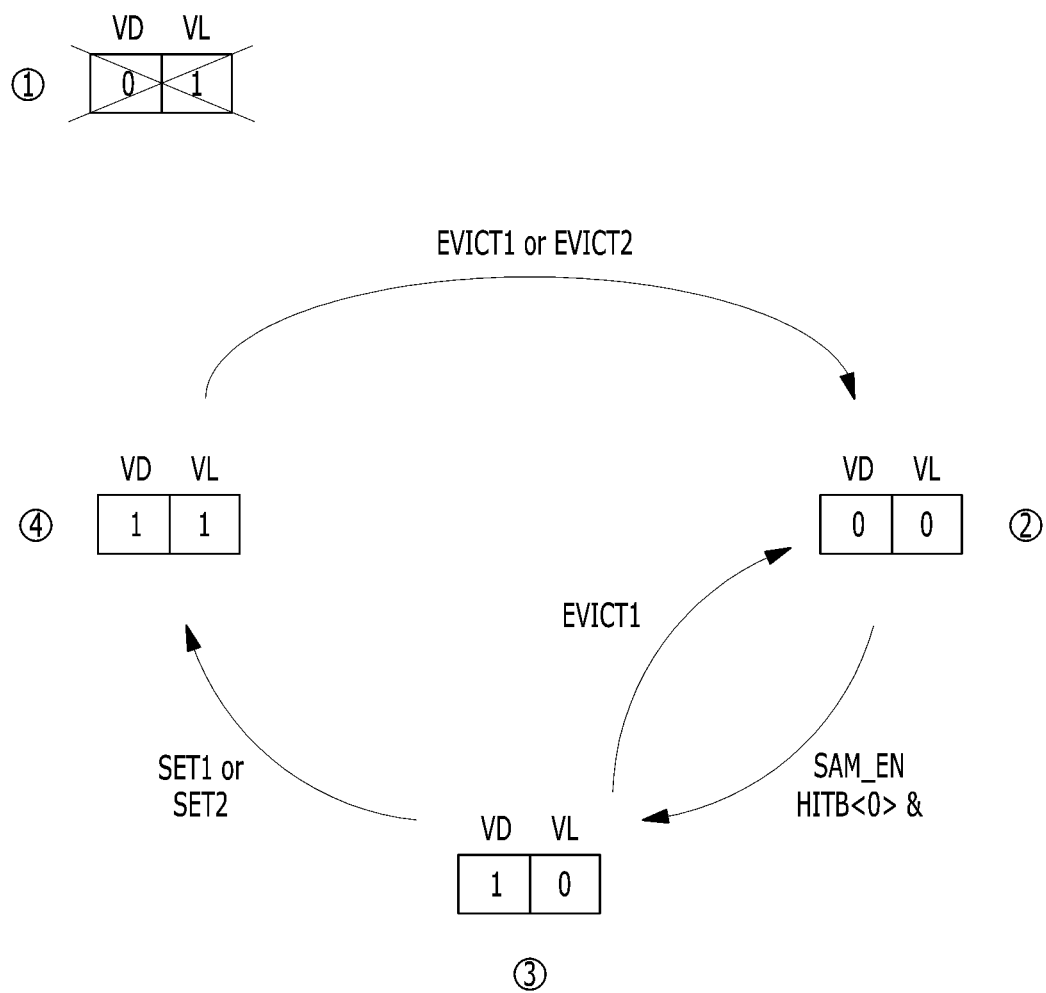
FIG. 5 is an embodiment of a state diagram for describing set and release of a valid bit and valid-lock bit of a setting circuit of FIG. 4.

FIG. 5 is an embodiment of a state diagram for describing set and release of the valid bit VD and the valid-lock bit VL of the setting circuit 2146 of FIG. 4.

Referring to FIG. 5, case (①) corresponds to the case where the valid bit VD and the valid-lock bit VL are "01" does not exist. That is, in accordance with the embodiment, the valid-lock bit VL may be set only when the valid bit VD is set.

Case (②) corresponds to the case where both the valid bit VD and the valid-lock bit VL are released to "00". In this case, the setting circuit 2146 may generate the first control signal EMPTY to set the valid bit VD when the sampling enable signal SAM_EN and the no-hit signal HITB<0> are activated. At this time, in order to release the valid bit VD, the first control signal EMPTY may have a logic high level. In order to set the valid bit VD, the first control signal EMPTY may have a logic low level.

Case (③) corresponds to the case where the valid bit VD is set to "1" and the valid-lock bit VL is released to "0". In this case, the setting circuit 2146 may generate the first control signal EMPTY to release the valid bit VD according to the first eviction signal EVICT1. The setting circuit 2146 may generate the second control signal VL_P to set the valid-lock bit VL, according to the first setting signal SET1 or the second setting signal SET2.

Case (④) corresponds to a case where both the valid bit VD and the valid-lock bit VL are set to "11". In this case, the setting circuit 2146 may generate the first control signal EMPTY and the second control signal VL_P to release the valid bit VD and the valid-lock bit VL, according to the first eviction signal EVICT1 or the second eviction signal EVICT2.

Figure 6:
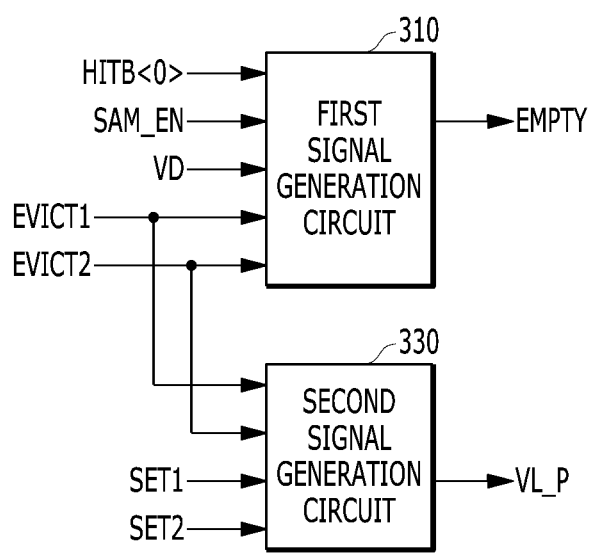
FIG. 6 is a detailed block diagram illustrating an embodiment of the setting circuit of FIG. 4.

FIG. 6 is a detailed block diagram illustrating an embodiment of the setting circuit 2146 of FIG. 4. Referring to FIG. 6, the setting circuit 2146 may include a first control signal generation circuit 310 and a second control signal generation circuit 330.

The first control signal generation circuit 310 may deactivate the first control signal EMPTY to a logic low level, when the sampling enable signal SAM_EN and the no-hit signal HITB<0> are activated in a state that the valid bit VD is released. As a result, the latch circuit 212 may store the sampling address SAM_ADD and then set the valid bit VD. The first control signal generation circuit 310 may activate the first control signal EMPTY to a logic high level, when any of the first eviction signal EVICT1 and second eviction signal EVICT2 is activated. As a result, the latch circuit 212 may release the valid bit VD.

Figure 7:
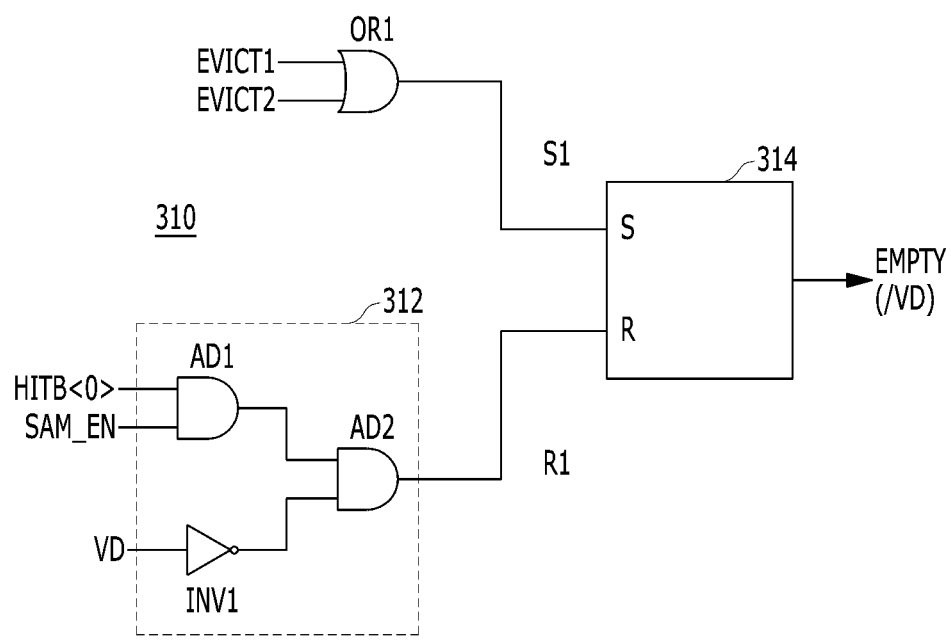
FIG. 7 is a detailed block diagram illustrating an embodiment of a first control signal generation circuit of FIG. 6.

FIG. 7 is a detailed block diagram illustrating an embodiment of the first control signal generation circuit 310 of FIG. 6. Referring to FIG. 7, the first control signal generation circuit 310 may include a reset signal generation circuit 312, a first OR gate OR1, and a first SR latch 314. The reset signal generation circuit 312 may include first and second AND gates AD1 and AD2, and a first inverter INV1. The first AND gate AD1 may perform a logic AND operation on the sampling enable signal SAM_EN and the no-hit signal HITB<0>. The first inverter INV1 may invert the valid bit VD. The second AND gate AD2 may perform a logic AND operation on outputs of the first AND gate AD1 and the first inverter INV1. The reset signal generation circuit 312 may activate a reset signal R1 to a logic high level, when the sampling enable signal SAM_EN and the no-hit signal HITB<0> are activated in a state that the valid bit VD is released. The first OR gate OR1 may perform a logic OR operation on the first eviction signal EVICT1 and the second eviction signal EVICT2, to generate a set signal 51. The first SR latch 314 may generate the first control signal EMPTY that is set according to the set signal 51, and reset according to the reset signal R1. Different logic may be used to perform the operations of the first control signal generation circuit 310 in other embodiments.

Referring back to FIG. 6, the second control signal generation circuit 330 may activate the second control signal VL_P to a logic high level, when any of the first setting signal SET1 and the second setting signal SET2 is activated. As a result, the latch circuit 212 may set the valid-lock bit VL. The second control signal generation circuit 330 may deactivate the second control signal VL_P to a logic low level when any of the first eviction signal EVICT1 and the second eviction signal EVICT2 is activated. As a result, the latch circuit 212 may release the valid-lock bit VL.

Figure 8:
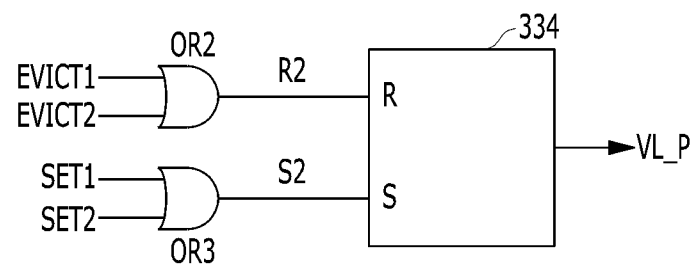
FIG. 8 is a detailed block diagram illustrating an embodiment of a second control signal generation circuit of FIG. 6.

FIG. 8 is a detailed block diagram illustrating an embodiment of the second control signal generation circuit 330 of FIG. 6. Referring to FIG. 8, the second control signal generation circuit 330 may include second and third OR gates OR2 and OR3, and a second SR latch 334. The second OR gate OR2 may perform a logic OR operation on the first eviction signal EVICT1 and the second eviction signal EVICT2 to generate a reset signal R2. The third OR gate OR3 may perform a logic OR operation on the first setting signal SET1 and the second setting signal SET2, to generate a set signal S2. The second SR latch 334 may generate the second control signal VL_P that is set according to the set signal S2, and reset according to the reset signal R2.

FIGS. 9 to 13 illustrate various embodiments relating to a method for generating a target address during operation of a semiconductor memory device.

Figure 9:
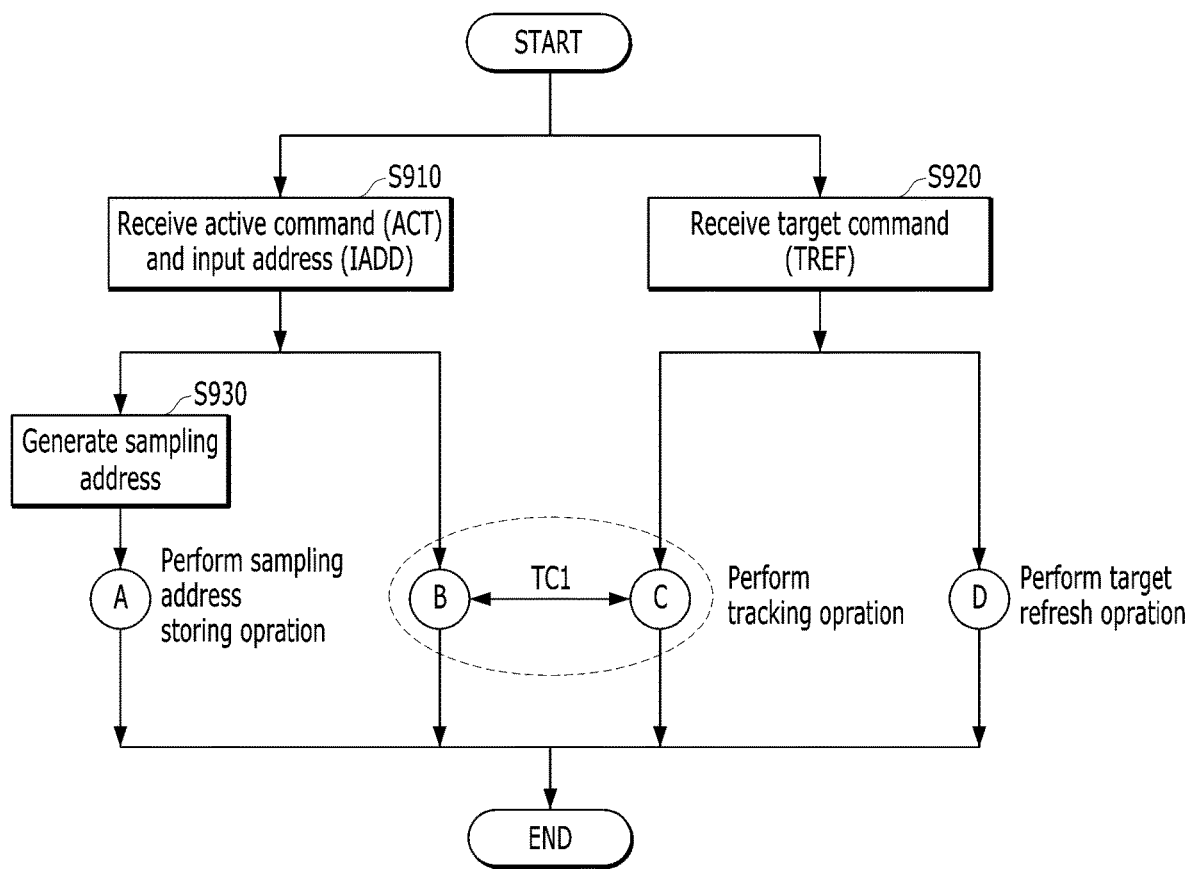
FIG. 9 is a flow chart of a method for controlling a semiconductor memory device in accordance with an embodiment.

FIG. 9 is a flow chart for describing an operation of a semiconductor memory device in accordance with an embodiment. Referring to FIG. 9, the active address generation circuit 122 receives and stores an input address IADD, which may be input together with an active command ACT, in order to output an active address ACT_ADD (operation S910). A target refresh command TREF is activated when the active command ACT is input a certain number of times (operation S920). The random sampling circuit 124 activates a sampling enable signal SAM_EN at a random point and samples the active address ACT_ADD in order to output a sampling address SAM_ADD according to the sampling enable signal SAM_EN (operation S930).

The latch control circuit 214 of each of the first to m-th address storing circuits 210_1 to 210_m may perform a sampling address storing operation (A) to store the sampling address SAM_ADD as a latch address LADD into the latch circuit 212.

FIGS. 10 and 11A to 11C illustrate additional operations and examples relating to a sampling address storing operation (A) of a semiconductor memory device according to an embodiment. In particular, FIGS. 11A to 11C show examples where first to fifth address storing circuits 210_1 to 210_5 are provided. The semiconductor memory device may include a different number of address storing circuits in another embodiment.

Figure 10:
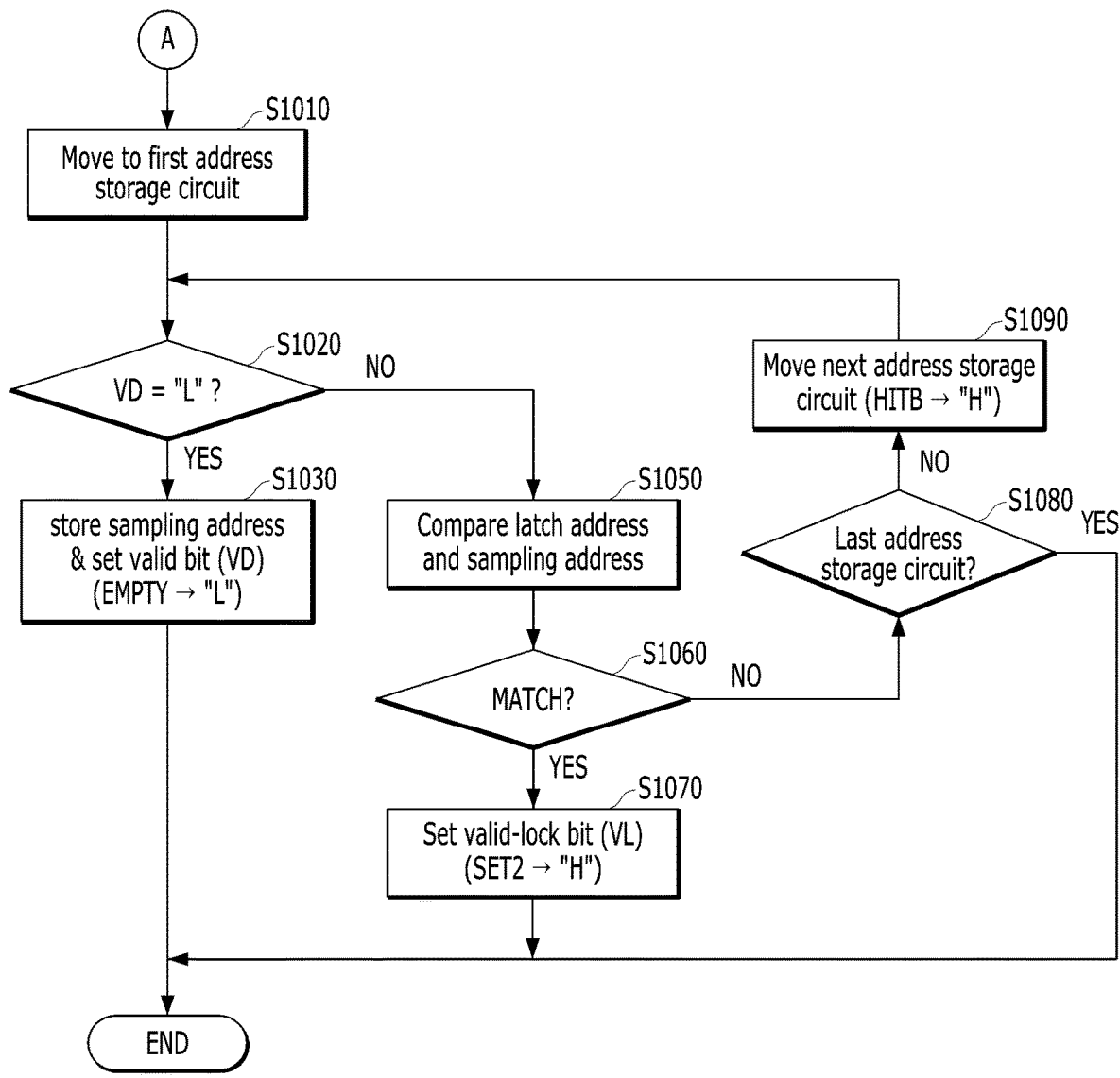
FIG. 10 is a flow chart for describing a sampling address storing operation of a semiconductor memory device in accordance with an embodiment.

Referring to FIG. 10, the first address storing circuit 210_1 operates first according to sampling enable signal SAM_EN (operation S1010). The first address storing circuit 210_1 checks whether a valid bit VD of the latch circuit 212 is released (operation S1020).

When a valid bit VD is released to a low bit (e.g., "YES" in operation S1020), the first address storing circuit 210_1 stores the sampling address SAM_ADD as the latch address LADD and then sets the valid bit VD (operation S1030). For example, the latch control circuit 214 of the first address storing circuit 210_1 may deactivate a first control signal EMPTY to a logic low level, in order to allow the latch circuit 212 to store the sampling address SAM_ADD, and may set the valid bit VD. After setting the valid bit VD, the operation (A) may be terminated.

When the valid bit VD is set to a high bit (e.g., "NO" at operation S1020), the first address storing circuit 210_1 compares the sampling address SAM_ADD with the latch address LADD (operation S1050). When the comparison result indicates a match (e.g., "YES" at operation S1060), the first address storing circuit 210_1 sets a valid-lock bit VL (operation S1070). For example, the latch control circuit 214 of the first address storing circuit 210_1 may activate a second setting signal SET2 and a second control signal VL_P to a logic high level in order for the latch circuit 212 to set the valid-lock bit VL. After setting the valid-lock bit VL, the operation (A) may be terminated.

When the comparison result does not indicate a match (e.g., "NO" at operation S1060), the first address storing circuit 210_1 activates a no-hit signal HITB<0> and provides it to the second address storing circuit 210_2 (e.g., "NO" at operation S1080). The second address storing circuit 210_2 operates according to sampling enable signal SAM_EN and the no-hit signal HITB<0> (operation S1090).

The second address storing circuit 210_2 may store the sampling address SAM_ADD as the latch address LADD according to the valid bit VD (operations S1020 and S1030) or may set the valid-lock bit VL according to the comparison result of the sampling address SAM_ADD with the latch address LADD (operations S1050 to S1070). When the last address storage circuit 210_m fails to store the sampling address SAM_ADD (e.g., "YES" at operation S1080), the sampling address SAM_ADD may be discarded without being stored.

Referring to FIG. 11A, when the latch addresses "B", "C", "D", and "E" are stored in the address storing circuits 210_1, 210_2, 210_3, and 210_5, respectively, the sampling address "A" may be input. Since the valid bit VD is set and the latch addresses "B", "C", and "D" stored in the address storing circuits 210_1, 210_2, and 210_3 do not match the sampling address "A", the sampling address "A" moves to the address storing circuit 210_4. Since the valid bit VD is released, the address storing circuit 210_4 may store the sampling address "A" as the latch address and set its valid bit VD, thereby finishing the sampling address storing operation (A).

Referring to FIG. 11B, the sampling address "C" is input at a time when the latch addresses "B", "C", "D", and "E" are stored in the address storing circuits 210_1, 210_2, 210_3, and 210_5, respectively. Since the valid bit VD is set and the latch address "B" stored in the address storing circuit 210_1 does not match the sampling address "C", the sampling address "C" moves to the address storing circuit 210_2. The address storing circuit 210_2 may set its valid-lock bit VL since the latch address "C" is identical to the sampling address "C", thereby finishing the sampling address storing operation (A).

Referring to FIG. 11C, the sampling address "F" is input at a time when the latch addresses "B", "C", "D", "A", and "E" are stored in the address storing circuits 210_1 to 210_5, respectively. Since all valid bits VD are set and the latch addresses "B", "C", "D", "A", and "E" are do not match the sampling address "F", the sampling address "F" may be discarded without being stored, thereby finishing the sampling address storing operation (A).

Figure 12:
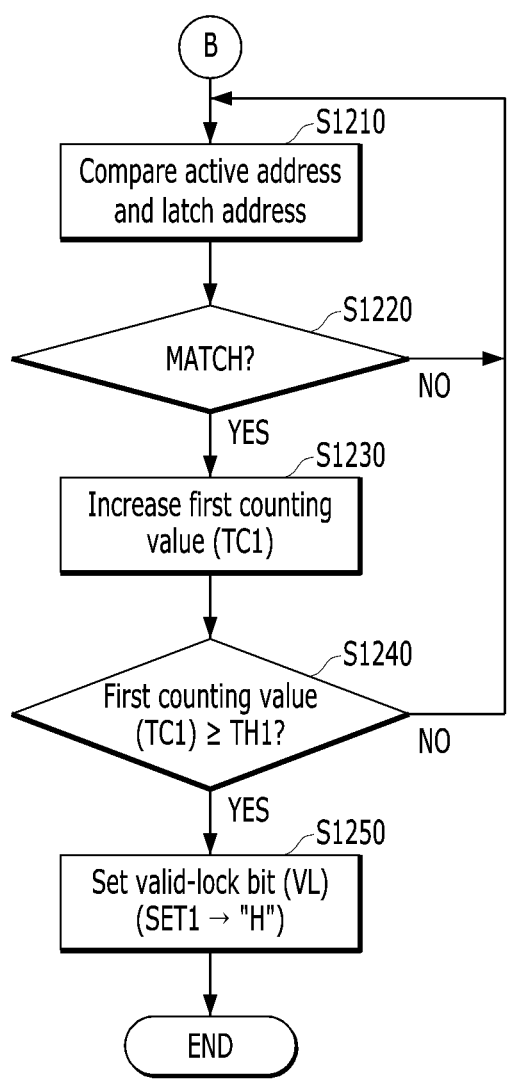
FIGS. 12 and 13 are flow charts for describing a tracking operation of a semiconductor memory device in accordance with an embodiment.
Figure 13:
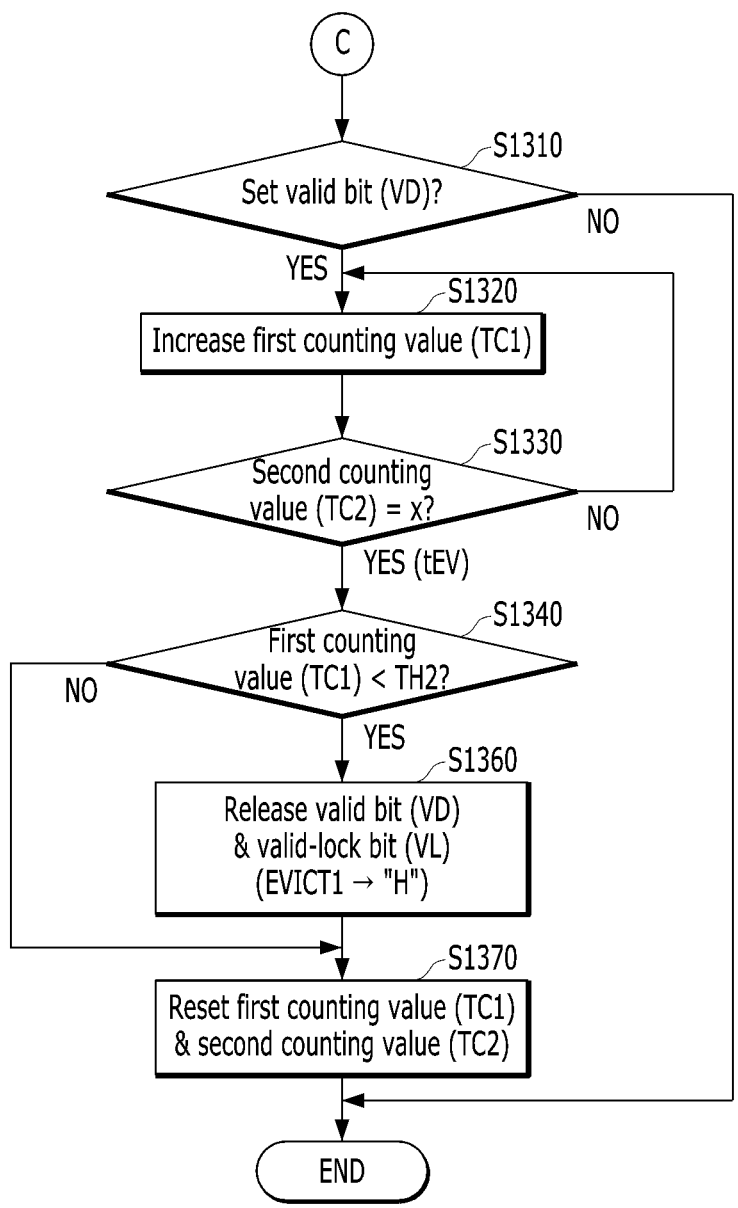

FIGS. 12 and 13 illustrate embodiments relating to tracking operations (B and C) which may be performed by the tracking circuit 216 of the semiconductor memory device in accordance with an embodiment. For example, the tracking circuit 216 of each of the first to m-th address storing circuits 210_1 to 210_m may perform a tracking operation (B and C) to track the latch address LADD according to the active address ACT_ADD during an evaluation period (tEV) in which the target refresh command TREF is activated a certain number of times.

Referring to FIG. 12, the tracking comparator 2162 of the tracking circuit 216 compares the active address ACT_ADD with the latch address LADD (operation S1210). When the comparison result indicates a match (e.g., "YES" at operation S1220), the first counter 2164 increases a first counting value TC1 (operation S1230). When the first counting value TC1 is greater than or equal to a first threshold value TH1 (e.g., "YES" at operation S1240), the decision circuit 2168 activates a first setting signal SET1 and the latch control circuit 214 sets the valid-lock bit VL according to the first setting signal SET1 (operation S1250). The tracking operation (B) is terminated.

Referring to FIG. 13, when the valid bit VD is set (e.g., "YES" at operation S1310), the second counter 2166 of the tracking circuit 216 increases a second counting value TC2 when the target refresh command TREF is activated (operation S1320). When the valid bit VD is released (e.g., "NO" at operation S1310), the tracking operation (C) is terminated.

When the second counting value TC2 becomes "x", one evaluation period (tEV) is defined (e.g., "YES" at operation S1330). When the first counting value TC1 is less than the second threshold value TH2 during the evaluation period (tEV) (e.g., "YES" at operation S1340), the decision circuit 2168 activates a first eviction signal EVICT1. The latch control circuit 214 may release the valid bit VD and the valid-lock bit VL according to the first eviction signal EVICT1 (operation S1360). The decision circuit 2168 resets the first counting value TC1 of the first counter 2164 and the second counting value TC2 of the second counter 2166 (operation S1370). The tracking operation (C) is terminated.

When the first counting value TC1 is greater than or equal to the second threshold value TH2 during the evaluation period (tEV) (e.g., "NO" at operation S1340), the decision circuit 2168 may reset the first counting value TC1 of the first counter 2164 and the second counting value TC2 of the second counter 2166 without further operation for release or set. For reference, since the first counting value TC1 is reset at an end of one evaluation period (tEV), tracking operation (B) may be performed for one evaluation period (tEV).

Figure 14:
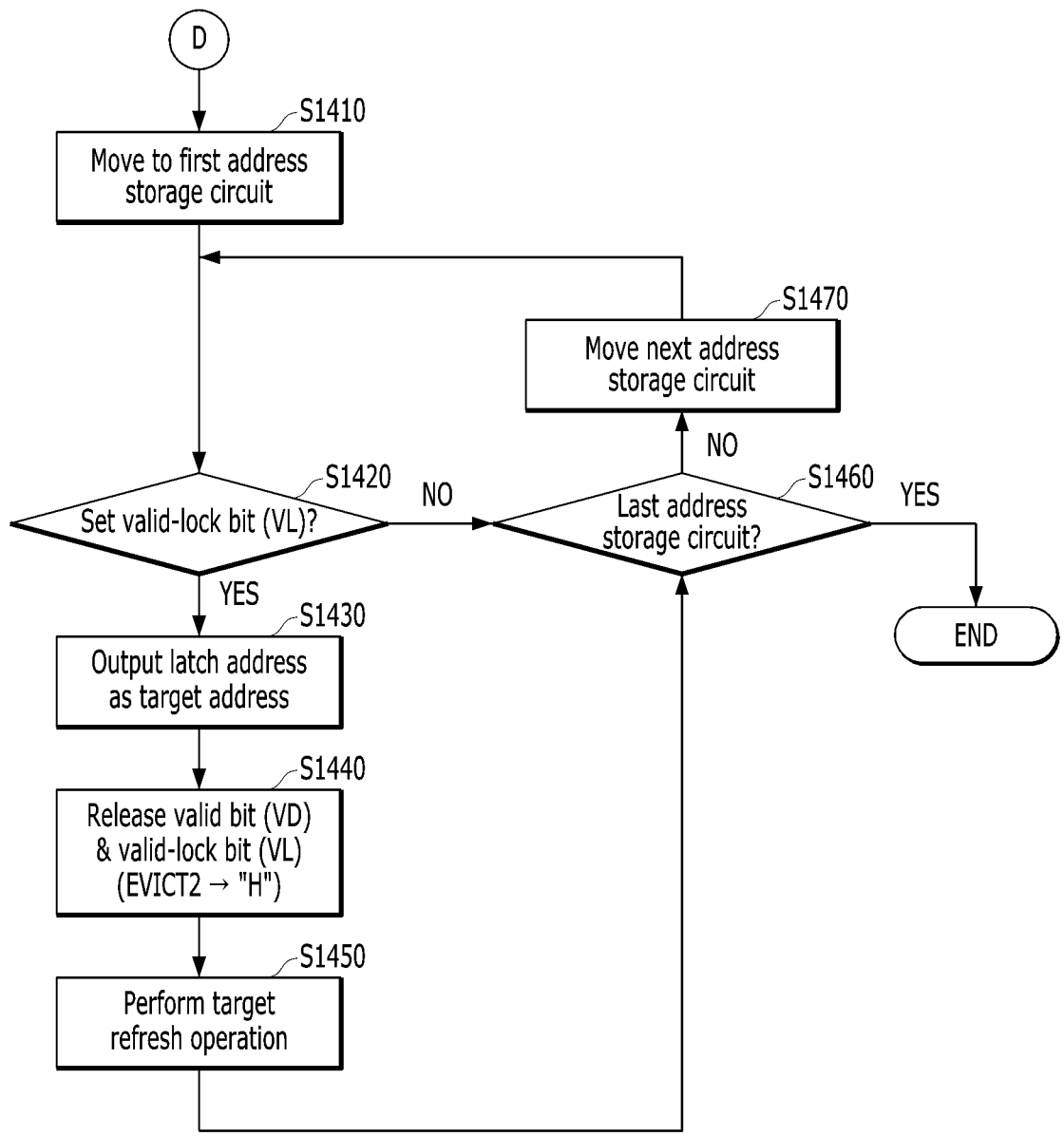
FIG. 14 is a flow chart for describing a target refresh operation of a semiconductor memory device in accordance with an embodiment.

FIG. 14 illustrates a target refresh operation (D) performed for the semiconductor memory device in accordance with an embodiment. For example, FIG. 14 illustrates an embodiment performed when the target refresh command TREF is activated. When TREF is activated, the output control circuit 218 of each of the first to m-th address storing circuits 210_1 to 210_m sequentially outputs the latch address LADD as a target address TADD according to a valid-lock bit VL, and the row control circuit 150 may perform a target refresh operation (D) on word lines corresponding to the target address TADD.

Referring to FIG. 14, the latch selection circuit 230 sequentially activates each bit of a latch selection signal SEQ<0:m> when the target refresh command TREF is activated. The first address storing circuit 210_1 operates first according to a first bit SEQ<0> of the latch selection signal SEQ<0:m> (operation S1410). When the valid-lock bit VL is set (e.g., "YES" at operation S1420), the first address storing circuit 210_1 outputs the latch address LADD as the target address TADD (operation S1430). At this time, the output control circuit 218 activates a second eviction signal EVICT2 after outputting the latch address LADD as the target address TADD, so that the latch control circuit 214 may release the valid bit VD and the valid-lock bit VL (operation S1440). The row control circuit 150 may perform the target refresh operation (D) on word lines corresponding to the target address TADD (operation S1450).

When the valid-lock bit VL is released ("NO" at operation S1420) or after the target refresh operation (operation S1450), the second address storing circuit 210_2 operates according to a second bit SEQ<1> of the latch selection signal SEQ<0:m> ("NO" at operation 1460 and S1470). Likewise, the second address storing circuit 210_2 may selectively output the latch address LADD as the target address TADD according to the valid-lock bit VL (operations S1420 to S1450). After sequentially performing the steps described above ("YES" at operation S1460), operation (D) may be terminated.

FIG. 15 is a diagram describing a state of latch circuit 212 in accordance with an embodiment. Referring to FIG. 15, the sampling address "A" is input when latch addresses "B", "C", "D", and "E" are stored in address storing circuits 210_1, 210_2, 210_3, and 210_5, respectively. Since the valid bit VD is released, the address storing circuit 210_4 stores the sampling address "A" as the latch address and sets its valid bit VD by a sampling address storing operation.

Next, a tracking operation is performed according to the active command ACT and the target refresh command TREF. The address storing circuits 210_1 to 210_5 may track that the active addresses "C", "D", and "E" are input more than once (e.g., greater than or equal to the first threshold value TH1) during an evaluation period (tEV) in which the target refresh command TREF is activated a certain number of times. Accordingly, the address storing circuits 210_2, 210_3, and 210_5 may set the valid-lock bit VL thereof.

When the target refresh command TREF is activated, the address storing circuits 210_1 to 210_5 sequentially output the latch addresses as the target addresses according to the respective valid-lock bits VL, so that the row control circuit 150 may perform a target refresh operation on word lines corresponding to the target addresses. For example, the address storing circuits 210_2, 210_3, and 210_5, (among the address storing circuits 210_1 to 210_5) sequentially output the latch addresses "C", "D", and "E" as the target addresses. After outputting the latch addresses "C", "D", and "E", the address storing circuits 210_2, 210_3, and 210_5 release the valid bit VD and the valid-lock bit V. The other address storing circuits 210_1 and 210_4 do not perform any operation to set or release the valid bit VD and the valid-lock bit VL.

Figure 16:
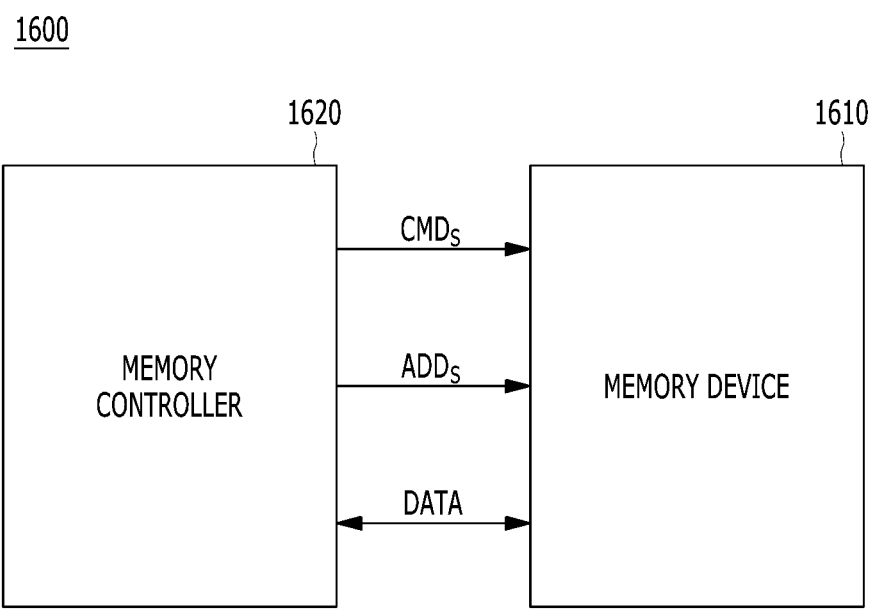
FIG. 16 is a block diagram illustrating a memory system in accordance with an embodiment.

FIG. 16 is a block diagram illustrating a memory system 1600 in accordance with an embodiment. Referring to FIG. 16, the memory system 1600 may include a memory device 1610 and a memory controller 1620. The memory controller 1620 may control an operation of the memory device 1610 by applying command signals CMDs and addresses ADDs to the memory device 1610 and exchanges data DATA with the memory device 1610 in read and write operations. The memory controller 1620 may provide the command signals CMDs (e.g., an active command ACT, a precharge command PCG, a read command RD, a write command WT, or a refresh command REF) to the memory device 1610 by sending the command signals CMDs to the memory device 1610. When the active command ACT is to be input to the memory device 1610, the memory controller 1620 may send the addresses ADDs for selecting a cell block and a word line to be activated in the memory device 1610. The memory controller 1620 may periodically send the refresh command REF to the memory device 1610. The refresh command REF may include a normal refresh command NREF and a target refresh command TREF.

The memory device 1610 may be one described, for example, with reference to FIG. 1. When the memory device 1610 is the memory device 100 of FIG. 1, the random sampling circuit 124 may sample an input address IADD, corresponding to the active command ACT at a random point, to generate a sampling address SAM_ADD. The target address generation circuit 130 may include a plurality of address storing circuits 210 suitable for storing the sampling address SAM_ADD as a latch address LADD and for storing a valid bit VD, and a valid-lock bit VL. The valid bit VD may indicate whether the latch address LADD is valid or not, and the valid-lock bit VL may indicate whether the latch address LADD has been accessed more than a certain number of times. The target address generation circuit 130 may sequentially output the latch address LADD stored in the respective address storing circuits 210, as a target address TADD, according to the valid bit VD and the valid-lock bit VL stored in the respective the address storing circuits 210.

Accordingly, the memory system 1600 may perform a target refresh operation by tracking a randomly sampled address, thereby preventing unnecessary refresh operations from being performed according to the same addresses. Thus, it is possible to improve refresh efficiency and to reduce the possibility that word line disturbance may occur. Also, in accordance with one or more embodiments, the efficiency of a refresh operation may be improved by performing a target refresh operation by tacking a randomly sampled address.

In accordance with an embodiment, a memory controller includes an input to receive a first address and at least one processor to generate a target address for a target refresh operation based on the first address. The input and at least one processor may correspond, for example, to any of the embodiments described herein. For example, the input and the at least one processor may correspond to one or more of the command input circuit 172, address input circuit 174, command decoder 176, active address generation circuit 122, random sampling circuit 124, and target address generation circuit 130 shown in FIG. 1. The first address may be address ADD input into the address input circuit 174, the internal address IADD input into the active address generation circuit 122 and random sampling circuit 124 or the sampled address SAM_ADD.

In operation, the at least one processor receives a second address, compares the second address to the first address stored in a storage area (e.g., of address storing circuits of the target address generation circuit 130), controls output of the first address (e.g., by output control circuit 218 in FIG. 3) as a target address (TADD) when the second address equals the first address, and sends the output first address to a controller (e.g., row control circuit 150 in FIG. 1) to perform the target refresh operation based on the target address. The second address may be another one of address ADD input into the address input circuit 174, the internal address IADD input into the active address generation circuit 122 and random sampling circuit 124 or the sampled address SAM_ADD. In one embodiment, the first address and the second address may be randomly sampled from an active address circuit.

While the present invention has been described with respect to the various embodiments, it will be apparent to those skilled in the art that various changes and modifications may be made without departing from the spirit and scope of the invention as defined in the following claims. For example, the logic gates and transistors illustrated in the above embodiments should be realized in different positions and types according to the polarity of an input signal.

What is claimed is:

1. A semiconductor memory device, comprising:
   a cell array including a plurality of word lines;
   a plurality of address storing circuits, each of the plurality of address storing circuits suitable for storing a sampling address as a latch address, a valid bit indicating whether the latch address is valid, and a valid-lock bit indicating whether the latch address is accessed more than a certain number of times, each of the plurality of address storing circuits further suitable for outputting the latch address as a target address according to the valid bit and valid-lock bit; and
   a row control circuit suitable for refreshing one or more word lines based on the target address in response to a refresh command.

2. The semiconductor memory device of claim 1, further comprising: a random sampling circuit suitable for sampling an active address input with an active command at a random point in order to generate the sampling address.

3. The semiconductor memory device of claim 1, wherein:
   each of the address storing circuits stores the corresponding sampling address as the latch address when the valid bit is released, and sets the valid bit after storing the latch address.

4. The semiconductor memory device of claim 1, wherein each of the address storing circuits sets the valid-lock bit when the valid bit is set and when:
   the sampling address is identical to a latch address previously stored in each of the address storing circuits, or
   an active address identical to the latch address is input more than a first preset number of times during an evaluation period in which the refresh command is activated a certain number of times.

5. The semiconductor memory device of claim 4, wherein each of the address storing circuits releases the valid bit and the valid-lock bit when the valid bit is set and when:
   the active address identical to the latch address is input less than a second preset number of times during the evaluation period, or
   the latch address is output as the target address according to the refresh command, wherein the second preset number is less than the first preset number.

6. The semiconductor memory device of claim 1, wherein each of the address storing circuits includes:
- a latch circuit suitable for storing the latch address, the valid bit, and the valid-lock bit;
- a tracking circuit suitable for increasing a first counting value according to a comparison result of the latch address and an active address input with an active command and for activating a first setting signal when the first counting value is greater than or equal to a first threshold value, during an evaluation period when the valid bit is set;
- a latch control circuit suitable for setting the valid-lock bit when the latch address is identical to the sampling address when the valid bit is set or when the first setting signal is activated; and
- an output control circuit suitable for outputting the latch address as the target address when the valid-lock bit is set at a time when the refresh command is activated.

7. The semiconductor memory device of claim 6, wherein the latch control circuit:
- performs a sequential search of the address storing circuits to determine if any of the address storing circuits has a valid bit that is released;
- when a result of the sequential search determines that one of the address storing circuits has a valid bit that is released, the latch control circuit stores the sampling address as the latch address in the one of the address storing circuits and sets the valid bit of the one of the address storing circuits,
- when a result of the sequential search determines that none of the address storing circuits has a valid bit that is released, the latch control circuit discards the sampling address without being stored.

8. The semiconductor memory device of claim 6, wherein the tracking circuit activates a first eviction signal when the first counting value is less than a second threshold value during the evaluation period, and wherein the latch control circuit releases the valid bit and the valid-lock bit according to the first eviction signal.

9. The semiconductor memory device of claim 8, wherein the tracking circuit includes:
- a tracking comparator suitable for outputting a count hit signal by comparing the active address with the latch address;
- a first counter suitable for increasing the first counting value according to the count hit signal;
- a second counter activated according to the valid bit and suitable for increasing a second counting value when the refresh command is activated; and
- a decision circuit suitable for generating the first setting signal or the first eviction signal based on the first counting value until the second counting value reaches a set number of times.

10. The semiconductor memory device of claim 9, wherein, until the second counting value reaches the set number of times, the decision circuit:
- activates the first setting signal when the first counting value is greater than or equal to the first threshold value, and
- activates the first eviction signal when the first counting value is less than the second threshold value.

11. The semiconductor memory device of claim 9, wherein the first threshold value is set to a maximum value of the first counter and wherein the second threshold value is set to 1.

12. The semiconductor memory device of claim 8, wherein:
- the output control circuit activates a second eviction signal after outputting the latch address as the target address, and
- the latch control circuit releases the valid bit and the valid-lock bit according to the second eviction signal.

13. The semiconductor memory device of claim 12, wherein the latch control circuit includes:
- a sampling comparator activated according to the valid bit and suitable for outputting a sampling hit signal when the latch address is identical to the sampling address and outputting a no-hit signal when the latch address is not identical to the sampling address;
- a sampling counter suitable for increasing a sampling counting value according to the sampling hit signal and outputting a second setting signal according to the sampling counting value; and
- a setting circuit suitable for generating:
  - a first control signal for setting/releasing the valid bit according to a sampling enable signal, a no-hit signal provided from the previous latch control circuit, the first eviction signal, and the second eviction signal, and
  - a second control signal for setting/releasing the valid-lock bit according to the first setting signal, the second setting signal, the first eviction signal, and the second eviction signal.

14. The semiconductor memory device of claim 13, wherein the setting circuit includes:
- a first control signal generation circuit suitable for generating the first control signal to set the valid bit when the sampling enable signal and the no-hit signal are activated in a state that the valid bit is released, and to release the valid bit when any of the first eviction signal and the second eviction signal is activated; and
- a second control signal generation circuit suitable for generating the second control signal to set the valid-lock bit when any of the first setting signal and the second setting signal is activated and to release the valid-lock bit when any of the first eviction signal and the second eviction signal is activated.

15. A semiconductor memory device, comprising:
- a random sampling circuit suitable for sampling active addresses input with an active command at random points and to output sampling addresses;
- a plurality of address storing circuits, each of the plurality of address storing circuits suitable for storing respective ones of the sampling addresses as latch addresses; and
- a row control circuit suitable for refreshing one or more word lines corresponding to a target address in response to a refresh command, wherein each of the address storing circuits includes:
  - a latch circuit suitable for storing a corresponding one of the latch addresses, a valid bit, and a valid-lock bit;
  - a tracking circuit suitable for activating a first setting signal or a first eviction signal according to a comparison result of the latch address and the active address during an evaluation period when the valid bit is set;
  - a latch control circuit suitable for setting the valid-lock bit when the latch address is identical to the sampling address and the valid bit is set or when the first setting signal is activated and for releasing the valid bit and the valid-lock when the first eviction signal is activated; and an output control circuit suitable for outputting the latch address as the target address when the valid-lock bit is set and when the refresh command is activated.

16. The semiconductor memory device of claim 15, wherein the tracking circuit:

increases a first counting value according to the comparison result, activates the first setting signal when the first counting value is greater than or equal to a first threshold value, and activates the first eviction signal when the first counting value is less than a second threshold value.

17. The semiconductor memory device of claim 15, wherein:

the output control circuit activates a second eviction signal after outputting the latch address as the target address, and the latch control circuit releases the valid bit and the valid-lock bit according to the second eviction signal.

18. A method of operating a semiconductor memory device including a plurality of latch circuits, each of the plurality of latch circuits storing a latch address, a valid bit and a valid-lock bit, the method comprising:

setting the valid bit of one of the latch circuits after storing a sampling address as the latch address into the one of the latch circuits;

setting the valid-lock bit of the one of the latch circuits when the sampling address identical to the latch address of the one of the latch circuits is input at least once; and outputting, from the one of the latch circuits, the latch address as a target address according to the valid bit and valid-lock bit and refreshing one or more word lines based on the target address in response to a refresh command.

19. The method of claim 18, further comprising:

generating the sampling address by sampling an active address input with an active command at a random point.

20. The method of claim 18, further comprising:

setting the valid-lock bit of the one of the latch circuits when an active address, identical to the latch address of the latch circuit in which the valid bit is set, is input more than a first preset number of times during an evaluation period in which the refresh command is activated a certain number of time.

21. The method of claim 20, further comprising:

releasing, in the one of the latch circuits, the valid bit and the valid-lock bit when the active address, identical to the latch address of the one of the latch circuits in which the valid bit is set, is input less than a second preset number of times during the evaluation period.

22. The method of claim 18, further comprising:

releasing the valid bit and the valid-lock bit after outputting the latch address as the target address.

23. The method of claim 18, further comprising:

discarding the sampling address without being stored in one of the latch circuits when none of the valid bits of the latch circuits is released.

24. The method of claim 18, wherein the refreshing one or more word lines includes:

sequentially outputting the latch address of the one of the latch circuits as the target address when the valid-lock bit is set and when the refresh command is activated.

* * * * *